United States Patent
Ueno

(10) Patent No.: US 8,283,697 B2
(45) Date of Patent: Oct. 9, 2012

(54) INTERNAL COMBUSTION ENGINE IGNITER SEMICONDUCTOR DEVICE

(75) Inventor: Katsunori Ueno, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 21 days.

(21) Appl. No.: 12/959,144

(22) Filed: Dec. 2, 2010

(65) Prior Publication Data

US 2011/0133246 A1   Jun. 9, 2011

(30) Foreign Application Priority Data

Dec. 4, 2009 (JP) ................................. 2009-276804

(51) Int. Cl.
H01L 29/66  (2006.01)

(52) U.S. Cl. ................................. 257/140; 257/E29.197

(58) Field of Classification Search ................... 257/140, 257/E29.197; 123/618, 652
See application file for complete search history.

(56) References Cited

U.S. PATENT DOCUMENTS

| | | | |
|---|---|---|---|
| 5,798,538 A | 8/1998 | Nadd et al. | |
| 6,229,180 B1 | 5/2001 | Yoshida et al. | |
| 6,336,448 B1 | 1/2002 | Furuhata et al. | |
| 6,384,431 B1 * | 5/2002 | Takahashi et al. | 257/147 |
| 6,385,028 B1 | 5/2002 | Kouno | |
| 2002/0117712 A1 | 8/2002 | Matsudai et al. | |
| 2003/0136974 A1 | 7/2003 | Yedinak et al. | |
| 2008/0303057 A1 * | 12/2008 | Iwamuro | 257/141 |
| 2009/0114946 A1 * | 5/2009 | Ueno | 257/137 |

FOREIGN PATENT DOCUMENTS

| | | |
|---|---|---|
| JP | 06-268226 A | 9/1994 |
| JP | 09-162399 A1 | 6/1997 |
| JP | 2000-310173 A | 11/2000 |
| JP | 2002-004991 A | 1/2002 |
| JP | 3255147 B2 | 2/2002 |
| JP | 3302275 B2 | 7/2002 |
| JP | 3764343 B2 | 4/2006 |
| JP | 3911566 B2 | 5/2007 |
| JP | 4164962 B2 | 10/2008 |
| JP | 2009-105265 A | 5/2009 |
| JP | 2009-111304 A | 5/2009 |
| JP | 4263102 B2 | 5/2009 |
| JP | 2009-130096 A | 6/2009 |

* cited by examiner

*Primary Examiner* — William D Coleman
*Assistant Examiner* — Christine Enad
(74) *Attorney, Agent, or Firm* — Rossi, Kimms & McDowell LLP

(57) ABSTRACT

An internal combustion engine igniter semiconductor device is disclosed which is low cost yet secures energy withstand and reverse surge withstand capability. An IGBT includes a clamping diode between a collector electrode and a gate electrode. The IGBT has two n-type buffer layers of differing impurity concentrations between a $p^+$ substrate and an n-type base layer of the IGBT, wherein the total thickness of the two-layer buffer layer is 50 μm or less, and the overall impurity amount is $20 \times 10^{13}$ $cm^{-2}$ or less.

7 Claims, 11 Drawing Sheets

IGBT Reverse Withstand Voltage (V)

Buffer Layer Impurity Concentration (μm)

Buffer Layer Impurity Concentration (cm$^{-3}$)

Buffer Layer Overall Impurity Amount (×10$^{13}$cm$^{-2}$)

United States Patent US 8,283,697 B2

INTERNAL COMBUSTION ENGINE IGNITER SEMICONDUCTOR DEVICE

BACKGROUND OF THE INVENTION

A. Field of the Invention

The present invention relates to a semiconductor device used in an internal combustion engine igniter.

B. Description of the Related Art

A circuit shown in FIG. 2 includes primary side coil 45, which is an inductive load, and secondary side coil 42, and functions to cause an intermittent spark to be emitted by means of a high voltage generated in secondary coil 42 in response to an intermittent current flowing from power source 41 to primary side coil 45. As a product to which the circuit is applied, there is an internal combustion engine igniter (which may hereafter be referred to as an "igniter") that utilizes an intermittent spark emitted in internal combustion engine spark plug 44 connected to secondary side coil 42. To date, a bipolar transistor has been used in the internal combustion engine igniter (igniter) as switching unit 43 to cause the intermittent current to flow to the primary side coil, but in recent years this has been replaced with an insulated gate bipolar transistor (IGBT) (JP-A-2000-310173, JP-A-2002-4991, and Japanese Patent No. 4,263,102). In an IGBT used in this kind of igniter, as well as control circuit portion 21 for preventing the IGBT being destroyed due to an overcurrent, an overvoltage, or heat generation being built in, as shown in an IGBT main portion sectional view of FIG. 5, gate control circuit portion 17 shown in an equivalent circuit of the IGBT of FIG. 3 may be built in so that the IGBT has a function of monitoring an operational condition, and controlling a gate signal when there is an abnormality.

In order to reduce a surge voltage when an L load is turned off, it is known to provide an n-type region with an intermediate impurity concentration between a high resistance n-type base layer and a high impurity concentration n-type buffer layer of the IGBT (Japanese Patent No. 4,164,962 and JP-A-6-268226). Also, in order to prevent the IGBT from being destroyed by a surge voltage with a collector side as negative, generated in an L load circuit when the IGBT is turned off, there is known an IGBT configured to provide a collector region positioned on the collector side opposed to a front side IGBT region (JP-A-2009-105265). Also, in order to make it difficult for the IGBT to be destroyed by a surge voltage with a collector side as negative, generated in an igniter circuit when the IGBT is turned off, an IGBT is also commonly known that has an n-type buffer region with a p-n junction withstand voltage higher than an automobile battery voltage in a collector side p-n junction interface (JP-A-2009-130096). There also is a description relating to an IGBT wherein an n-type buffer layer is a two-layer configuration of differing impurity concentrations (Japanese Patent No. 3,764,343).

In the igniter inductive load circuit (FIG. 2), in a process wherein the current decreases sharply when the IGBT switches from an on condition to an off condition, a voltage in a direction (the IGBT collector side is the positive direction) that, in response to a coil inductance L and a change in a current flowing through the coil, suppresses the change rises sharply in primary side coil 45, and on the IGBT reaching the off condition, the voltage drops sharply. When the suddenly generated surge voltage (a few hundred volts) is clamped by a zener voltage of zener diode 16 (FIG. 3) disposed between the collector gates of the IGBT, the primary side coil voltage is induced in the secondary side coil, a reverse direction voltage is generated in the secondary side coil, a discharge is started, and energy accumulated in the inductor is released.

However, in the event that the discharge does not take place for some reason, it may happen that the energy accumulated in the inductor returns directly to the IGBT side, and a situation occurs wherein the IGBT itself has to consume the energy. A condition at this time is shown in FIG. 4. The horizontal axis shows time, and the vertical axis current or voltage. That is, on a voltage Vc generated on the collector side reaching a clamp voltage Vb of the diode between the gate and collector, the voltage is clamped, the gate voltage is positively biased by the current flowing through the diode flowing through gate resistor 36 in FIG. 3, the IGBT attains the on condition, and a current flows. While maintaining this condition, the current continues until 0 in a condition in which the large voltage Vb is applied to the IGBT. During this time, even in the event that the internal temperature of the IGBT rises due to a large incurred loss, the IGBT needs to withstand this without breaking down. A maximum incurred loss energy amount at this time is called an energy withstand. Unless there is a device breakdown due to a localized heat generation such as a latch-up caused by the configuration or structure of the circuit or IGBT, an energy amount reaching a physical thermal breakdown temperature as a silicon semiconductor is the limit of the energy withstand. For this reason, the capacity increases as a chip size increases. Also, when the radiation of heat to the exterior is good, the temperature rise is suppressed, and the capacity increases. Consequently, the energy withstand is one factor when determining a limit in the event of wishing to reduce the chip size in order to lower the cost of a product. A heretofore known sectional structure of this kind of igniter IGBT is shown in FIG. 5. The IGBT of FIG. 5 includes n+ buffer layer 24 and n base layer 26 on p+ substrate 25, and active region 20 that causes a main current of the IGBT to flow is provided in a central portion of the n base layer surface. The surface of active region 20 includes an emitter electrode to which p base region 6, n emitter region 7, gate insulating film 13, gate terminal 2, gate electrode 14, and emitter terminal 3 are connected, and the like. Pressure resisting region 18 is disposed in a periphery encircling active region 20. Control circuit portion block 21 including a horizontal MOSFET is monolithically formed of channel region 9, source 10-1, drain 10-2, gate oxidizing film 11, gate electrode 12, and the like, on the right side of active area 20 in FIG. 5. P region 8 is a region for, by short circuiting with the emitter electrode, reducing a current flowing to the circuit portion 21 by transferring a current flowing into channel region 9 to the emitter electrode, and protecting the IGBT from an element breakdown due to a parasitic current. From a manufacturing aspect, it is often the case that clamping diode 16 connected between gate 2 and collector 1 of the IGBT is formed of a polysilicon layer deposited across an insulating film on the IGBT substrate surface in such a way that a current flows along the surface.

Meanwhile, with an automobile ignition device such as an igniter, when a 12V power source of a battery mounted in an automobile is carelessly turned off, there is a mode wherein, as a current flowing through a load inductor decreases sharply, the inductor generates a reverse bias voltage ($-Ldi/dt$), as previously described. At this time, there is a demand for a reverse surge withstand capability (V) whereby there is no breakdown even when there is a reverse voltage and a current flows in the switching semiconductor element (IGBT). FIG. 7 shows a testing circuit that applies a reverse surge voltage. Capacitor 48 is charged from power source 49, and a current is caused to flow by switching this to the semiconductor side. At this time, a voltage equal to or greater than a reverse withstand voltage is applied to the IGBT, which is a semiconductor element, a current flows, and energy accumulated in the capacitor is released. The charging voltage at this time is called the reverse surge withstand capability (V). FIG. 6 shows a condition in the interior of the IGBT at this time, using FIG. 5. The reverse withstand voltage of the IGBT is determined by withstand voltage characteristics of a p-n junction (diode 19) formed of p-type substrate 25 and the buffer layer 24. On a reverse voltage with the emitter 3 as positive and collector 1 as negative being applied to the IGBT, p-n junction 17 included in active region 20 and control circuit portion 21 on the device surface side attains a forward bias condition, and the current flows at a low voltage. At this time, when it is assumed from FIG. 7 that the dynamic resistance of the IGBT reverse withstand voltage characteristic is 0, the energy consumed by the IGBT is calculated as:

$$\frac{\int P dt}{C_C} = V_B(V_S - V_B) - \frac{R_1 V_B}{(R_1 + R_2)} \Big[ (V_S - V_B) + \frac{R_2}{(R_1 + R_2)} V_B \ln\Big|\frac{(R_1 + R_2)}{R_1}\Big(\frac{V_S}{V_B} - \frac{R_2}{(R_1 + R_2)}\Big)\Big|\Big]$$

Equation 1

P: consumed energy of semiconductor device,
Cc: capacitor capacity,
R1 and R2: circuit resistors (FIG. 7),
VB: IGBT reverse withstand voltage,
Vs: capacitor charging voltage As is understood from the equation, the consumed energy decreases as the IGBT reverse withstand voltage VB decreases. This is because the resistor R1 connected in series with the IGBT, and the resistor R2 connected in parallel, consume the rest of the energy. The lower the IGBT reverse withstand voltage VB, the more the reverse surge withstand capability (V) increases. This is shown in FIGS. 8 and 9, with FIG. 8 showing a relationship between the impurity concentration of IGBT buffer layer 24 and the reverse withstand voltage, and FIG. 9 showing a relationship between the reverse withstand voltage and the reverse surge withstand capability when actually measured. For this reason, it is necessary to lower the reverse withstand voltage in order to secure the reverse surge withstand capability. However, in an automobile application, it is required that the semiconductor does not break down even in the event that the battery is accidentally connected with the polarities reversed. For this reason, a reverse withstand voltage at least as high as the battery voltage (12V) is required. As it may happen that two batteries are used in series, a design is necessary wherein the reverse withstand voltage is at least 30V, and when considering reverse withstand voltage fluctuation and the like, 40V. For this reason, it is necessary to secure the reverse surge withstand capability while making the reverse withstand voltage a minimum of around 40V.

The present invention is directed to overcoming or at least reducing the effects of one or more of the problems set forth above.

SUMMARY OF THE INVENTION

The invention, having been contrived bearing in mind the heretofore described points, provides an internal combustion engine igniter semiconductor device at as low a cost as possible, while securing energy withstand and reverse surge withstand capability.

The invention provides an internal combustion engine igniter semiconductor device which includes a semiconductor substrate including a first conductive collector layer, a second conductive buffer layer, and a second conductive base layer in that order. The second conductive buffer layer has a second buffer layer with a higher impurity concentration than that of the second conductive base layer disposed on the second conductive base layer side, and a first buffer layer with a higher impurity concentration than that of the second buffer layer disposed on the first conductive collector layer side. An insulated gate bipolar transistor including a first conductive base region is disposed on a surface layer of the second conductive base layer of the semiconductor substrate. A gate electrode across a gate insulating film on a surface of the first conductive base region sandwiched between a second conductive emitter region is disposed on a surface layer in the first conductive base region and the second conductive base layer surface. There is an emitter electrode in common contact with a collector electrode, the second conductive base layer, and the second conductive emitter region on the first conductive collector layer surface. There is a clamp diode between the gate electrode and the collector electrode with the gate electrode side as an anode side. There is a control circuit which, being on the same semiconductor substrate as the insulated gate bipolar transistor, and enclosed in a ring form by another conductive region connected by wire to the emitter electrode, is configured in such a way as to detect an abnormal condition of the insulated gate bipolar transistor using a signal from the emitter electrode, and prevent a breakdown of the insulated gate bipolar transistor by controlling a gate voltage. A total thickness of the first buffer layer and second buffer layer is 50 μm or less, and an overall impurity amount of the two layers is $20 \times 10^{13}$ cm$^{-2}$ or less.

It is preferable that the thickness of the first buffer layer is from 1 to 10 μm or less, the impurity concentration of the first buffer layer is in the range of $2 \times 10^{16}$ cm$^{-3}$ to $8 \times 10^{16}$ cm$^{-3}$, the thickness of the second buffer layer is 49 μm or less, and the impurity concentration of the second buffer layer is in the range of $1 \times 10^{16}$ cm$^{-3}$ to $4 \times 10^{16}$ cm$^{-3}$. Also, it is also preferable that the total thickness of the first buffer layer and second buffer layer is 30 μm or more.

Furthermore, it is also preferable that the internal combustion engine igniter semiconductor device includes a trench filled with an insulator between the insulated gate bipolar transistor and the control circuit in place of the other conductive region connected to the emitter electrode. It is preferable that the depth of the trench reaches the first conductive collector layer. A configuration may also be adopted wherein the width of the trench is 1 μm or less, and a plurality thereof are provided in parallel. It is more preferable that the control circuit enclosed by the other conductive region connected to the emitter electrode is divided into insular circuit blocks, and each of the insular circuit blocks is connected by wire to the emitter electrode. Also, a high concentration other conductive band-like region may be interposed among the insular circuit blocks, and the high concentration other conductive band-like region connected by wire to the emitter electrode and other conductive region.

According to the invention, it is possible to suppress a rise of an on voltage while securing or increasing an energy withstand. Furthermore, a reduction of a chip size is possible, and it is possible to provide a low cost internal combustion engine igniter semiconductor device.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

Figure 1:
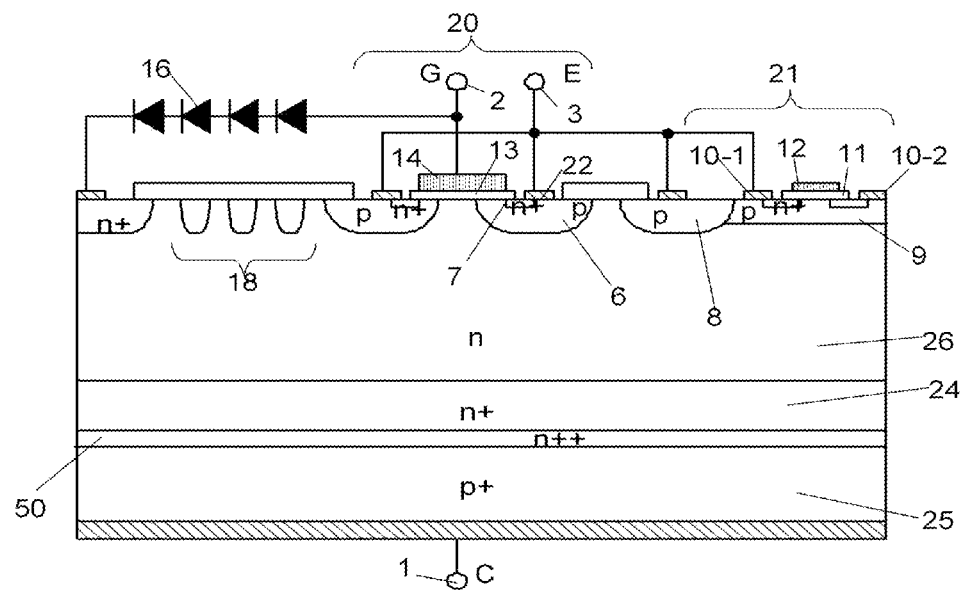
FIG. 1 is a main portion sectional view of an IGBT according to a first embodiment of the invention.
Figure 2:
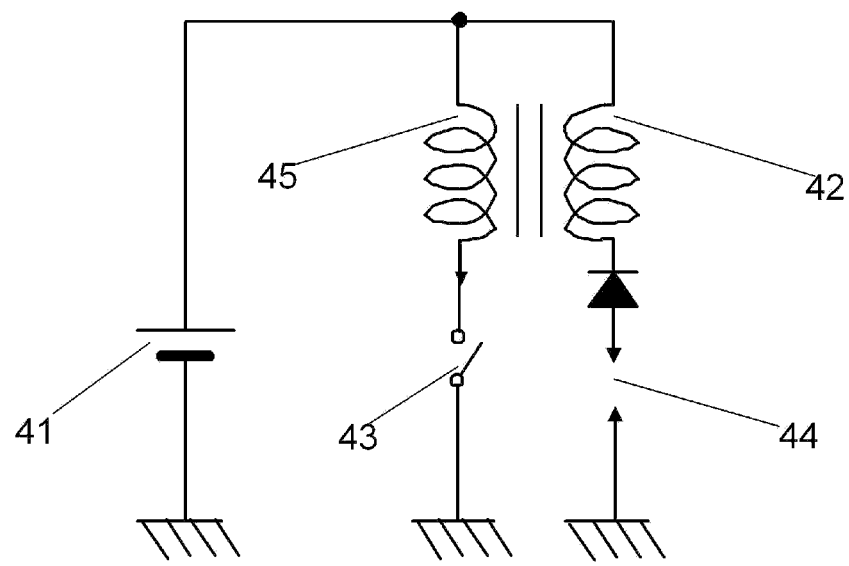
FIG. 2 is a basic configuration diagram of an igniter ignition circuit.
Figure 3:
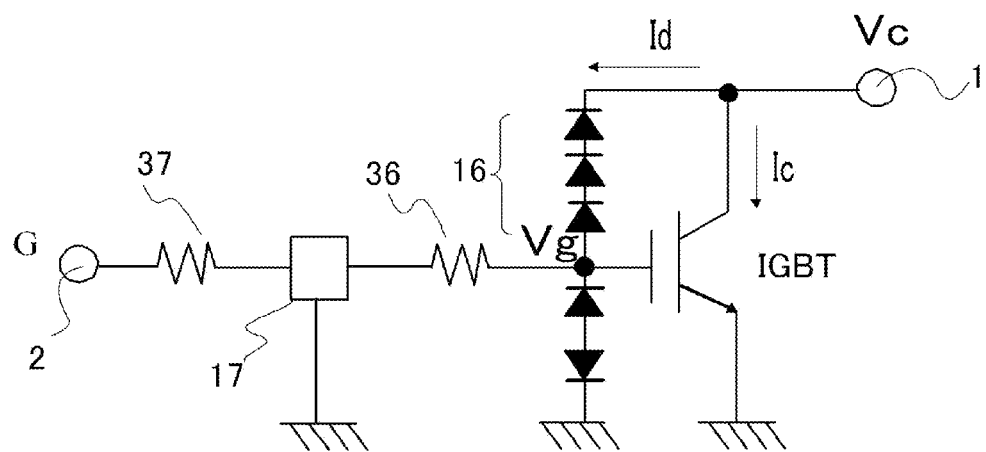
FIG. 3 is an equivalent circuit of an igniter IGBT according to the invention.
Figure 4:
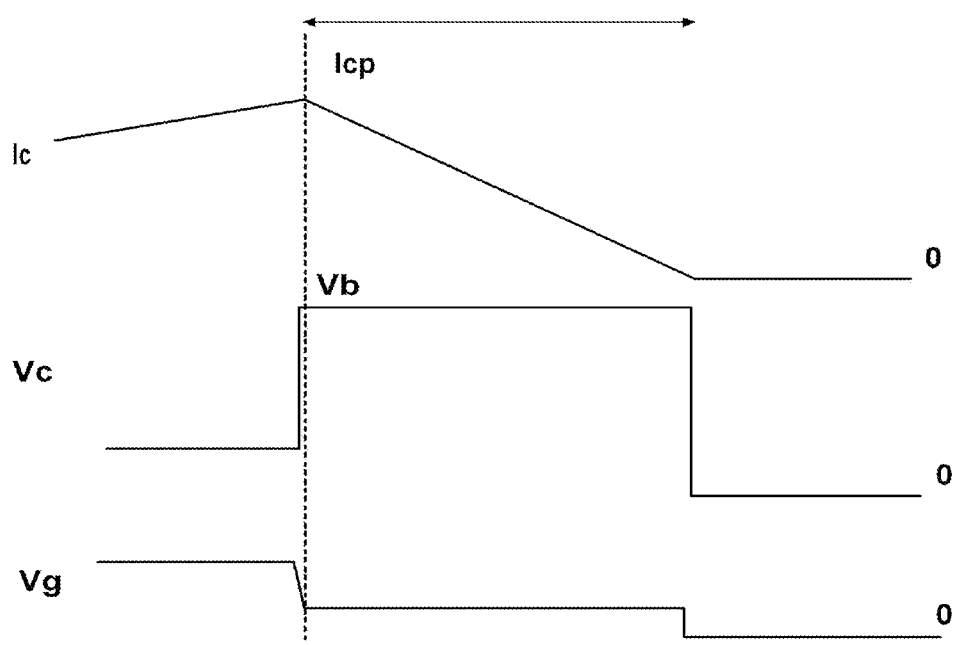
FIG. 4 is a waveform diagram of voltage, current, and gate voltage when measuring energy withstand.

Hereafter, a detailed description will be given, referring to the drawings, of embodiments of an internal combustion engine igniter semiconductor device of the invention. The invention is not limited to the details of the embodiments described hereafter, provided that it does not exceed the gist thereof.

First Embodiment

Figure 10:
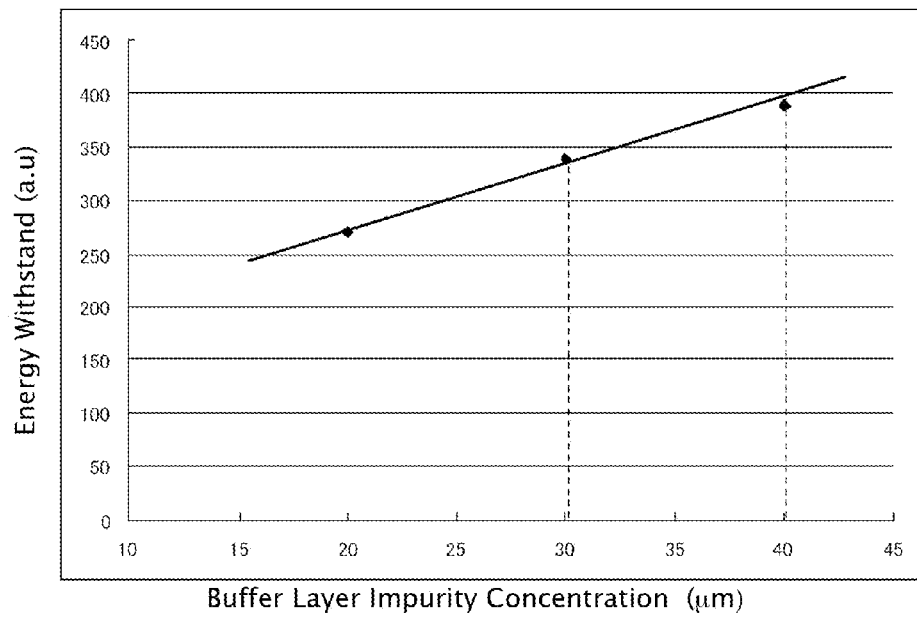
FIG. 10 is a diagram of a relationship between an IGBT buffer layer thickness and energy withstand.
Figure 11:
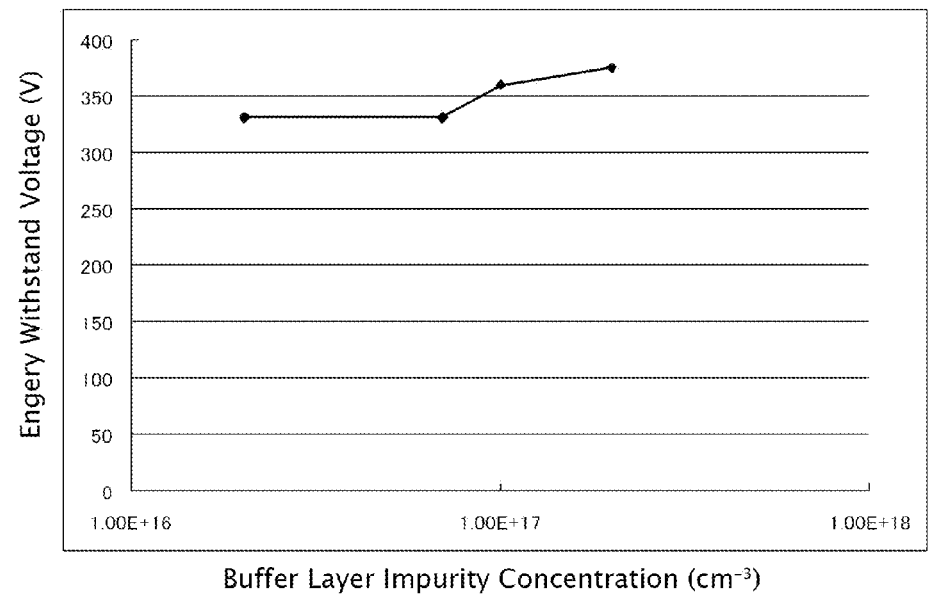
FIG. 11 is a diagram of a relationship between the IGBT buffer layer impurity concentration and energy withstand.

Hereafter, referring to the attached drawings, a detailed description will be given of a preferred embodiment of an internal combustion engine igniter semiconductor device, which is the invention. In the following description of the embodiment and attached drawings, the same reference numerals and characters are given to identical configurations, and a redundant description is omitted. Before describing the details of the embodiment of the invention, a description will be given of results obtained by carrying out a study of a heretofore known igniter IGBT. FIGS. 10 and 11 are diagrams showing a relationship of energy withstand with respect to buffer layer thickness and impurity concentration respectively. FIG. 11 shows that the dependency of the buffer layer impurity concentration on the energy withstand is low, being of the extent that characteristics improve slightly at a high impurity concentration of $1 \times 10^{17}$ cm$^{-3}$ or more. However, FIG. 10 shows that the dependency of the buffer layer thickness on the energy withstand is high, with the energy withstand increasing as the buffer layer becomes thicker. The reason for this is that, when a current flows in a condition in which a high voltage is applied to the IGBT, a loss occurs in an n-type base layer 26 of FIG. 5 through which a depletion layer is spread, and the temperature rises. That is, as a thermal runaway causing a thermal breakdown occurs on a hole injection from rear surface p$^+$ substrate 25 becoming larger, the farther pn junction 27 from n-type base layer 26 in which the loss occurs, the later the time at which the thermal runaway occurs. As a result, the temperature rise becomes gentler, and the thermal breakdown is alleviated. Furthermore, as the time at which the temperature due to the loss is highest is an initial time at which the current is largest, when this period passes, the temperature drops due to a radiation. Consequently, as it is possible to distance pn junction 27 from n-type base layer 26 by providing buffer layer 24, the energy withstand increases.

Figure 12:
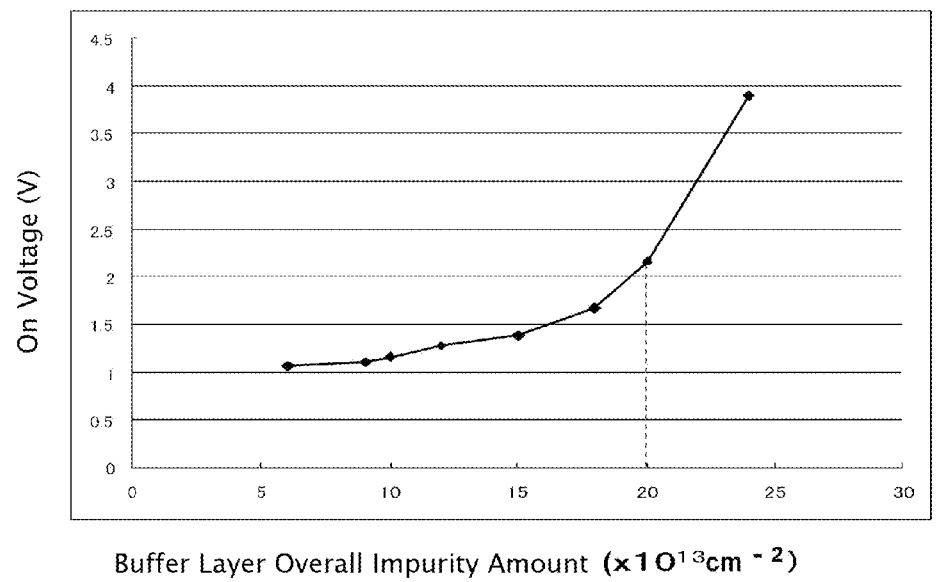
FIG. 12 is a diagram of a relationship between an IGBT buffer layer overall impurity amount and an on voltage.

However, on increasing the thickness of buffer layer 24 (with a constant impurity concentration) in order to distance pn junction 27 from n-type base layer 26, a phenomenon occurs in which the IGBT on-voltage rises. FIG. 12 shows the relationship between the product of the impurity concentration and thickness of the buffer layer 24, that is, the overall impurity amount, and the on-voltage. FIG. 12 shows that the on-voltage rises sharply from around the point at which the overall impurity amount of buffer layer 24 exceeds $20 \times 10^{13}$ cm$^{-2}$. In an IGBT in which the overall impurity amount is extremely high and the on-voltage is high, the I-V characteristic is not regular, having an abnormal waveform referred to as a so-called jumping waveform wherein the current only flows slightly although the collector voltage rises, but flows swiftly after a certain voltage is reached. It is known that this phenomenon is a phenomenon that occurs because, when a minority carrier injection from the collector side is slight, carrier accumulation in n-type base layer 26 is poor. An IGBT having an IV characteristic with this kind of abnormal waveform is not preferable because circuit noise and a large loss occur. That is, it means that, although the thicker buffer layer 24 becomes, the higher the energy withstand is, there is an upper limit to the thickness.

Figure 8:
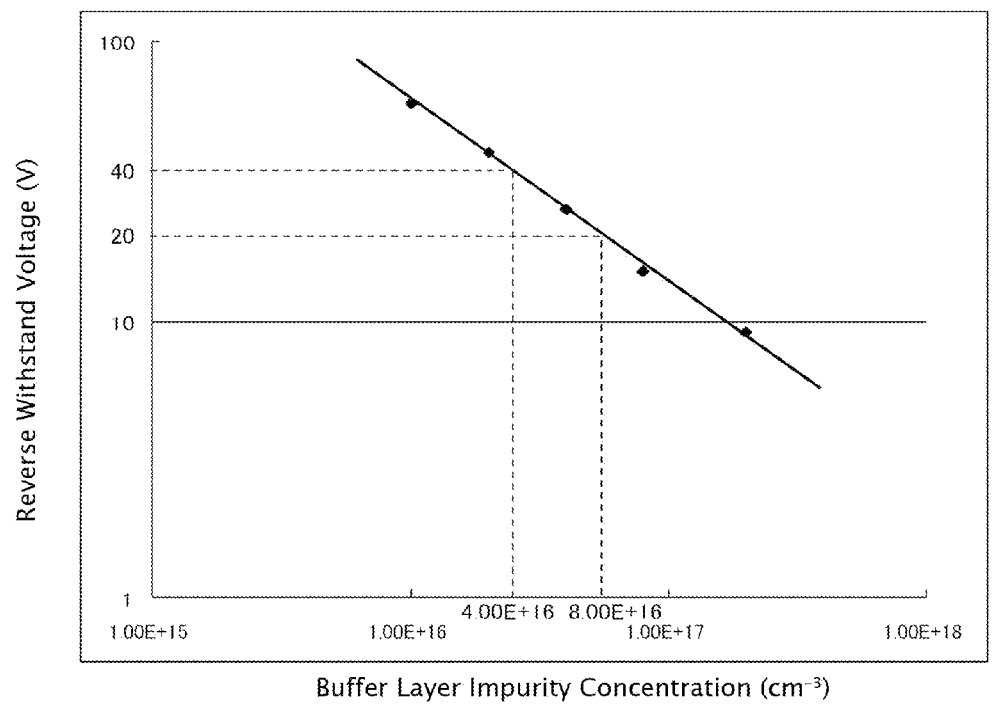
FIG. 8 is a diagram of a relationship between an IGBT buffer layer impurity concentration and reverse withstand voltage.
Figure 9:
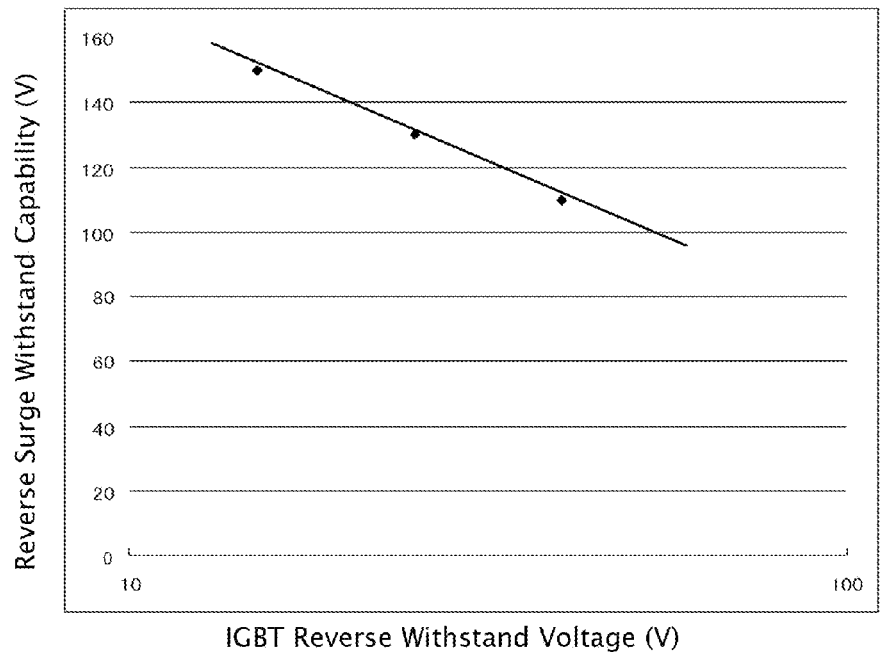
FIG. 9 is a diagram of a relationship between the IGBT reverse withstand voltage and a reverse surge withstand capability.

Meanwhile, with the igniter IGBT, in the case of a 12V battery, a reverse withstand voltage of preferably 40V or more is needed, as previously mentioned. By making the reverse withstand voltage of the IGBT 40V, it is possible to minimize the energy flowing through the IGBT at a time of a reverse connection while also safely dealing with a reverse connection of two series of car batteries (12V). From FIG. 9, which shows the relationship between the reverse withstand voltage and a reverse surge withstand capability, it is seen that the lower the reverse withstand voltage, the higher the reverse surge withstand capability. Also, it is seen from FIG. 8 that the buffer layer impurity concentration at which the reverse withstand voltage of 40V is obtained is around $4 \times 10^{16}$ cm$^{-3}$. However, in the case of the impurity concentration of $4 \times 10^{16}$ cm$^{-3}$, on the buffer layer thickness exceeding 50 μm when increasing the thickness in order to increase the energy withstand, the overall impurity amount, which is the product of the concentration and thickness, exceeds $20 \times 10^{13}$ cm$^{-2}$. As a result, the on-voltage rises sharply, as shown in FIG. 12, and a jumping waveform is seen in the I-V characteristic. Consequently, when 40V is necessary as the reverse withstand voltage of the IGBT, the upper limit of the buffer layer thickness is 50 µm in order to avoid a sharp rise of the on-voltage.

Figure 5:
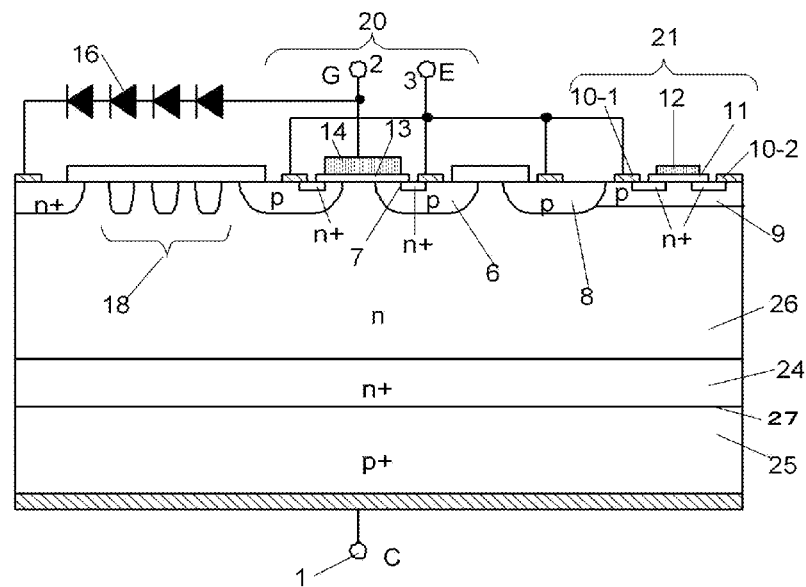
FIG. 5 is a main portion sectional view of a heretofore known igniter IGBT.
Figure 6:
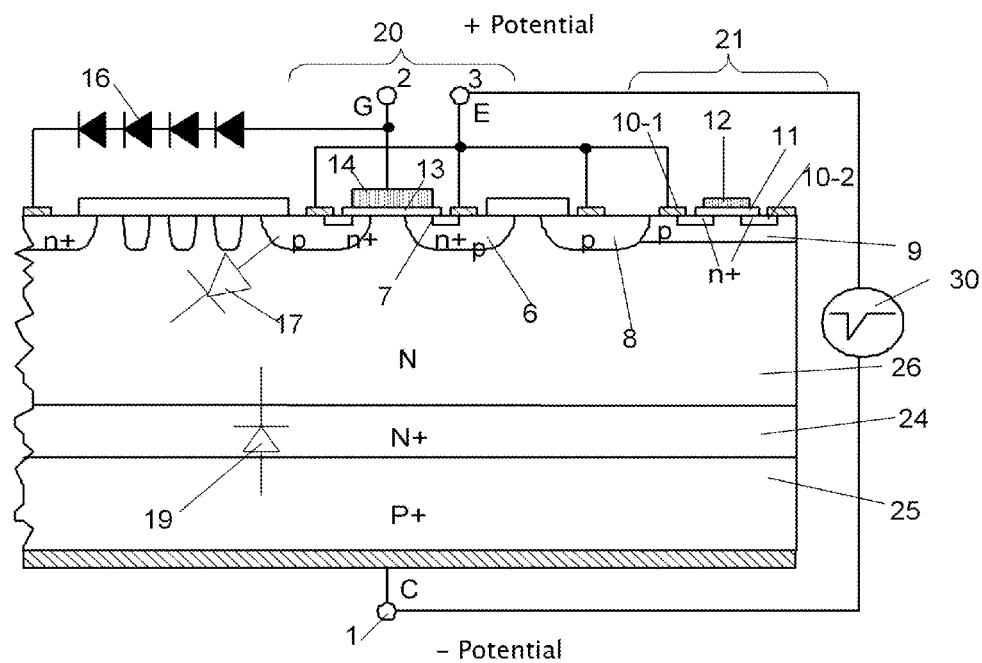
FIG. 6 is a main portion sectional view when applying a negative collector surge voltage, using FIG. 5.
Figure 7:
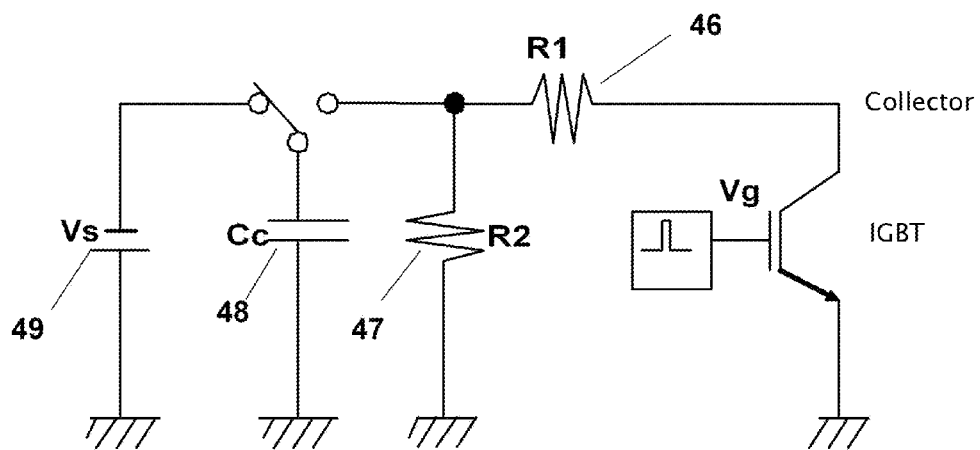
FIG. 7 is a negative collector surge testing circuit diagram.

Also, as the buffer layer (single layer) thickness of the heretofore known IGBT shown in FIG. 5 is 30 µm, an IGBT according to the invention wherein the buffer layer thickness exceeds 30 µm and is equal to or lower than 50 µm (30 µm<buffer layer thickness 50 µm), and wherein the overall impurity amount is $20 \times 10^{13}$ cm$^{-2}$, and a clamping diode is inserted between the gate and collector, is made the igniter IGBT according to the first embodiment in order to make the energy withstand higher than that of the heretofore known IGBT. By employing this kind of internal combustion engine igniter semiconductor device, it is possible to suppress the rise of the on-voltage while increasing the energy withstand beyond that of the heretofore known IGBT, as is clear from the description above.

For example, when making the buffer layer thickness 40 µm, the energy withstand increases by approximately 10% in comparison with the heretofore known case in which the buffer layer thickness is 30 µm, meaning that it is possible to reduce a chip size by a corresponding amount. In the event that the buffer layer thickness is 40 µm and the impurity concentration $1 \times 10^{16}$ cm$^{-3}$, the overall impurity amount is 40 µm$\times 1 \times 10^{16}$ cm$^{-3}$ making $4 \times 10^{13}$ cm$^{-2}$, meaning that the previously mentioned condition that the overall impurity amount of the buffer layer is equal to or lower than $20 \times 10^{13}$ cm$^{-2}$ is satisfied, and there is no steep rise of the on-voltage. The energy withstand also increases, as shown in FIG. 10.

Furthermore, as shown in FIG. 1, the IGBT employed having a two-layer structure buffer layer formed by newly adding first buffer layer 50 with a different impurity concentration to the heretofore known IGBT shown in FIG. 5, the impurity concentration of first buffer layer 50 on the side nearer a p$^+$ collector layer is made the kind of high impurity concentration that determines the reverse withstand voltage. For example, when a reverse withstand voltage of 40V is needed, the impurity concentration is equal to or lower than around $4 \times 10^{16}$ cm$^{-3}$, as previously mentioned, and equal to or lower than around $8 \times 10^{16}$ cm$^{-3}$ when the battery (12V) is a single series, as a reverse withstand voltage of around 20V is sufficient. As the spread of a depletion layer when the reverse withstand voltage is applied is at most around 1 µm, it is sufficient that the thickness of first buffer layer 50 is a thickness in excess of 1 µm. However, when considering forming the buffer layer with an epitaxial growth, a thickness of 2 or 3 µm, with which a stable formation is possible, is preferable. Furthermore, in order to keep the overall impurity amount at $20 \times 10^{13}$ cm$^{-2}$ or lower, it is preferable to make the thickness a maximum of 10 µm or less.

Meanwhile, second buffer layer 24 on the side farther from the p$^+$ collector layer is formed thickly in order that it is possible to maintain the energy withstand, as previously mentioned. However, in order to keep the overall impurity amount at $20 \times 10^{13}$ cm$^{-2}$ or lower, the impurity concentration is set on the low side. For example, when the added first buffer layer 50 is given an impurity concentration of $8 \times 10^{16}$ cm$^{-3}$ and a thickness of 2 µm ($2 \times 10^{-4}$ cm), with which a reverse withstand voltage of 20V is obtained, the overall impurity amount is $1.6 \times 10^{13}$ cm$^{-2}$. When giving the second buffer layer an impurity concentration of $2 \times 10^{16}$ cm$^{-3}$ and a thickness of 40 µm, the overall impurity amount is $8 \times 10^{13}$ cm$^{-2}$. The total overall impurity amount is $9.6 \times 10^{13}$ cm$^{-2}$, satisfying the condition that the overall impurity amount is equal to or lower than $20 \times 10^{13}$ cm$^{-2}$. Also, when first buffer layer 50 is given an impurity concentration of $4 \times 10^{16}$ cm$^{-3}$ and a thickness of 10 µm ($10 \times 10^{-4}$ cm), with which a reverse withstand voltage of 40V is obtained, the overall impurity amount is $4 \times 10^{13}$ cm$^{-2}$. When giving the second buffer layer an impurity concentration of $2 \times 10^{16}$ cm$^{-3}$ and a maximum thickness of 40 µm, the overall impurity amount is $8 \times 10^{13}$ cm$^{-2}$. The total overall impurity amount is $12 \times 10^{13}$ cm$^{-2}$, satisfying the condition that the overall impurity amount is equal to or lower than $20 \times 10^{13}$ cm$^{-2}$.

In this way, provided that the combination of the thicknesses and impurity concentrations of the first buffer layer and second buffer layer satisfies the conditions of an overall impurity amount of $20 \times 10^{13}$ cm$^{-2}$ or lower and a total thickness of 50 µm or less, it is possible to select from the following preferable ranges of impurity concentration and thickness. The preferable ranges of impurity concentration and thickness for the first buffer layer and second buffer layer are a thickness of 1 µm to 10 µm for the first buffer layer, an impurity concentration of $2 \times 10^{16}$ cm$^{-3}$ to $8 \times 10^{16}$ cm$^{-3}$ for the first buffer layer, a thickness of 49 µm or less for the second buffer layer, and an impurity concentration of $1 \times 10^{16}$ cm$^{-3}$ to $4 \times 10^{16}$ cm$^{-3}$ for the second buffer layer. Furthermore, when making the total thickness of the first buffer layer and second buffer layer 30 µm or more, it is preferable because the energy withstand increases beyond that of the heretofore known igniter IGBT.

A layered structure itself wherein the buffer layer is a two-layer structure of differing impurity concentrations has already been described in Japanese Patent No. 4,164,962, JP-A-6-268226, and Japanese Patent No. 3,764,343. However, the first two mentioned patent documents differ from the invention in the impurity concentration of the first buffer layer. In the last-mentioned patent document, the configuration being such that an n-type base layer of a semiconductor is formed by grinding thin a semiconductor substrate, the structure is for preventing a grinding error having a large effect on the on-voltage and switching characteristics. This structure envisages a case wherein the characteristics of the device are determined by the on-voltage and a switching loss when the structure is applied to an inverter, or the like, that carries out an operation at a few kHz or more. Consequently, the overall impurity amount of the two-layer buffer layer differs from that of the invention. Meanwhile, with the igniter according to the invention, the operating frequency is around 50 Hz, and moreover the duty is around 10%, meaning that, as loss occurring is not a problem, it is acceptable that switching speed is low, and it is normal that no control of switching speed is carried out due to lifetime, or the like.

As heretofore described, according to the invention, it is possible to provide a low cost igniter semiconductor device that curbs the rise of the on-voltage while keeping the energy withstand at a maximum limit, and at the same time maintaining the reverse surge withstand capability.

Second Embodiment

With the control circuit-equipped IGBT of the first embodiment, a configuration is such that p region 8 is provided between the control circuit portion and the main portion of the IGBT in order to curb the flowing in of a parasitic current due to a parasitic element operation and prevent an element breakdown, and is connected to emitter electrode 22 on a surface of IGBT active region 20 and to a MOSFET source and drain of control circuit 21. When attempting to prevent the element breakdown due to the parasitic current by separation distance alone, without providing this kind of parasitic current curbing portion, a separation distance of 500 µm is needed between the control circuit portion and the main portion of the IGBT. The chip size increases by a corresponding amount, and the chip cost rises.

Hereafter, a description will be given relating to a configuration wherein the configuration wherein the buffer layer is formed of two layers of differing concentrations, which is a characteristic of the IGBT of the first embodiment, is left as it is, and the separation distance between the control circuit portion and the main portion of the IGBT is made smaller still than that in the first embodiment by providing a new parasitic current curbing portion, thus reducing the chip size.

Figure 13:
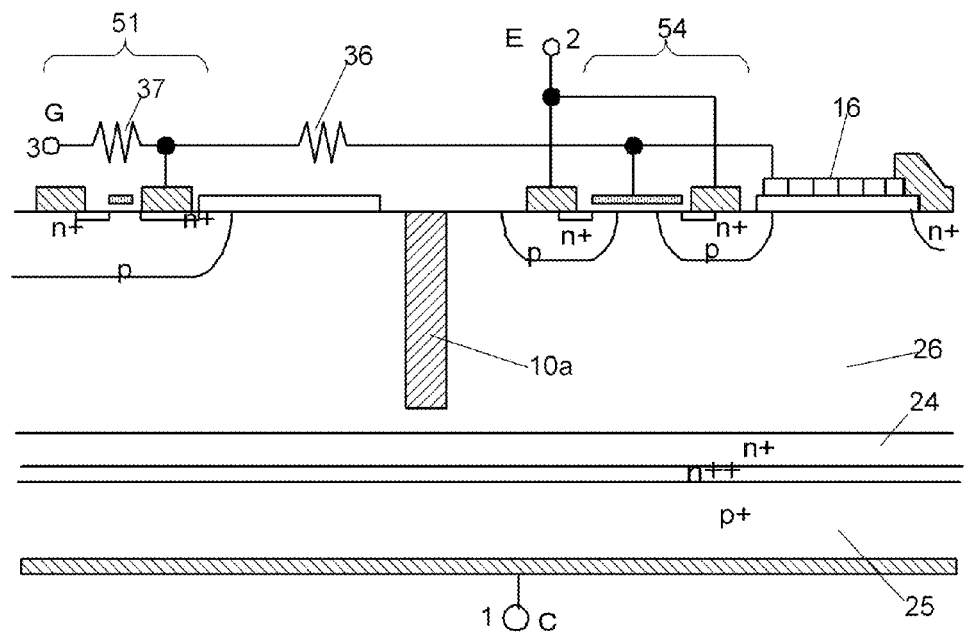
FIG. 13 is a main portion sectional view showing a semiconductor device according to a second embodiment of the invention.

FIG. 13 shows a main portion sectional view of an IGBT equipped with a protective circuit that fulfills a parasitic current curbing function, without increasing the chip size and efficiently areally, with the same kind of configuration as that of the previously described control circuit portion. The IGBT of FIG. 13 differs in the points of not including p region 8 disposed so as to enclose the periphery of the horizontal MOSFET of the control circuit portion in order to prevent a latch-up thereof, and the electrode configuration in contact with the surface of p region 8 and connected at the same potential to the IGBT emitter electrode and the source and drain of the control circuit portion, shown in FIG. 1. Instead of these, the IGBT includes a structure in which there is deep trench 10a between IGBT portion (an active region) 54 and protective circuit portion 51, and the inside thereof is filled with an insulating material, for example, a silicon dioxide ($SiO_2$) film, as shown in FIG. 13. $SiO_2$ has a thermal conductivity of only one hundredth of that of silicon. For this reason, it is possible to realize a thermal resistance equivalent to that of silicon of a thickness of 100 µm with a thickness of a mere 1 µm. Furthermore, as a hole current is blocked by trench 10a, the flow of the hole current into protective circuit portion 51 is also curbed, providing a double curbing effect against a parasitic current accompanying an IGBT operation.

Figure 14:
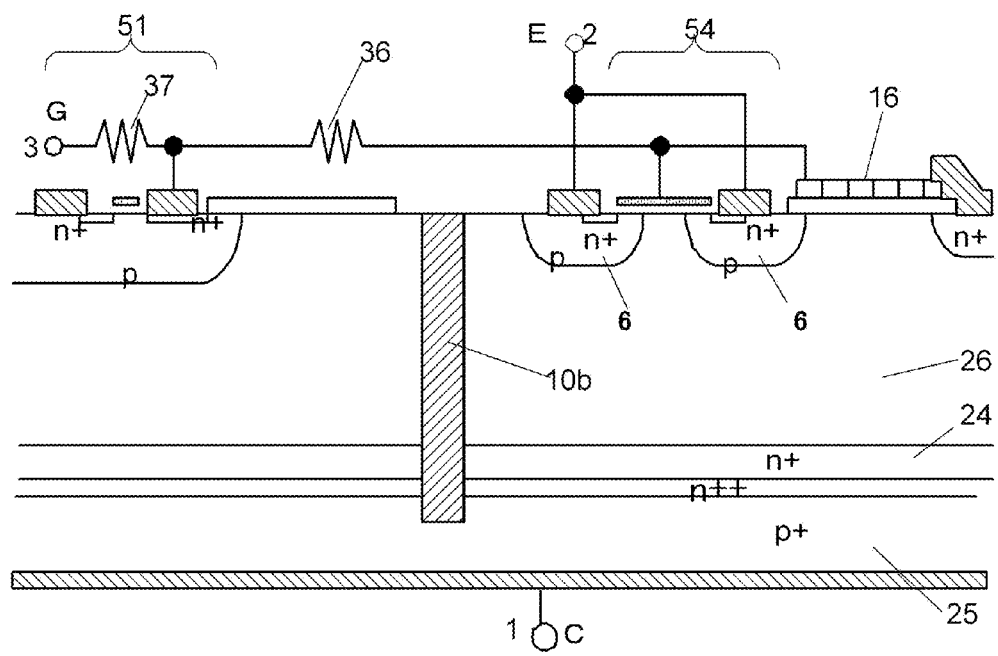
FIG. 14 is a main portion sectional view showing the semiconductor device according to the second embodiment of the invention.

However, on changing the depth of trench 10a and measuring the amount of the hole current flowing into protective circuit portion 51, it is found that the effect eventually increases when the depth of trench 10b is of a depth reaching a $p^+$ collector region vicinity on an anode side, as shown in FIG. 14. This phenomenon is particularly noticeable in an application wherein it is acceptable that the switching speed is low, and in particular in an engine ignition device, or the like. The reason for this is that, as the lifetime of a minority carrier in n and $n^+$ layers inside the silicon is set to be long, the minority carrier diffuses a long way. By adopting this kind of configuration, being separated by trench 10b in n base layer 26 and $n^+$ buffer layer 24 in which the lifetime is long, while in p regions 6, as the lifetime is short due to the high concentration p-type impurities, there is hardly any diffusion of the minority carrier, and it no longer happens that the current of IGBT 54 side flows into protective current 51 side. Consequently, when wishing to suppress the effect of the flowing in of the hole current, it is preferable to form trench 10b deep enough that it reaches $p^+$ collector region 25 of the collector, as shown in FIG. 14.

Figure 15:
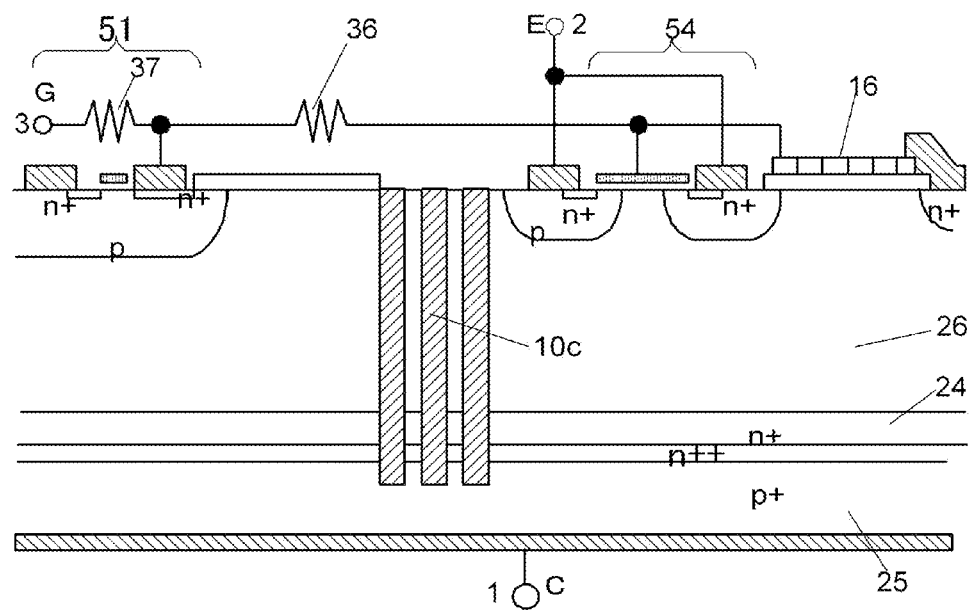
FIG. 15 is a main portion sectional view showing the semiconductor device according to the second embodiment of the invention.

Normally, when forming a trench and filling it with an insulating material, with a wide trench, an extremely thick insulating material has to be deposited in order to fill it. As previously mentioned, when curbing the flowing in of the hole current by the separation distance of the silicon region alone, a separation region of a width of 500 µm or more is needed. When attempting to obtain a thermal resistance equivalent to that of the wide separation region with an insulator separation, an insulator region with a width of at least 5 µm or more is needed. When making the trench width 5 µm, an insulating film deposited needs to be of 3 µm or more, but when making the trench width small at 1 µm or less, it is possible to make the thickness of the insulating film deposited 1 µm or less. Therein, by forming a necessary number of trenches 10c with a width of 1 µm, as shown in FIG. 15, it is possible to obtain an essentially high thermal resistance, even when the thickness of the insulating film deposited is reduced. By using this method, there is no need to deposit a thick insulating film in the manufacturing process, and it is possible to manufacture with a low-cost process.

By using this method, it is possible to reduce the heretofore known separation distance of IGBT portion 54 and protective circuit portion 51 to around one hundredth. Furthermore, as the design of a protective circuit for preventing a breakdown due to a parasitic current becomes unnecessary, freedom of layout design of protective circuit 51 portion increases, and it is possible to eliminate an unnecessary area, meaning that it is possible to realize a shortening of a development period, and a noticeable reduction in the area of the semiconductor chip.

Third Embodiment

Figure 16:
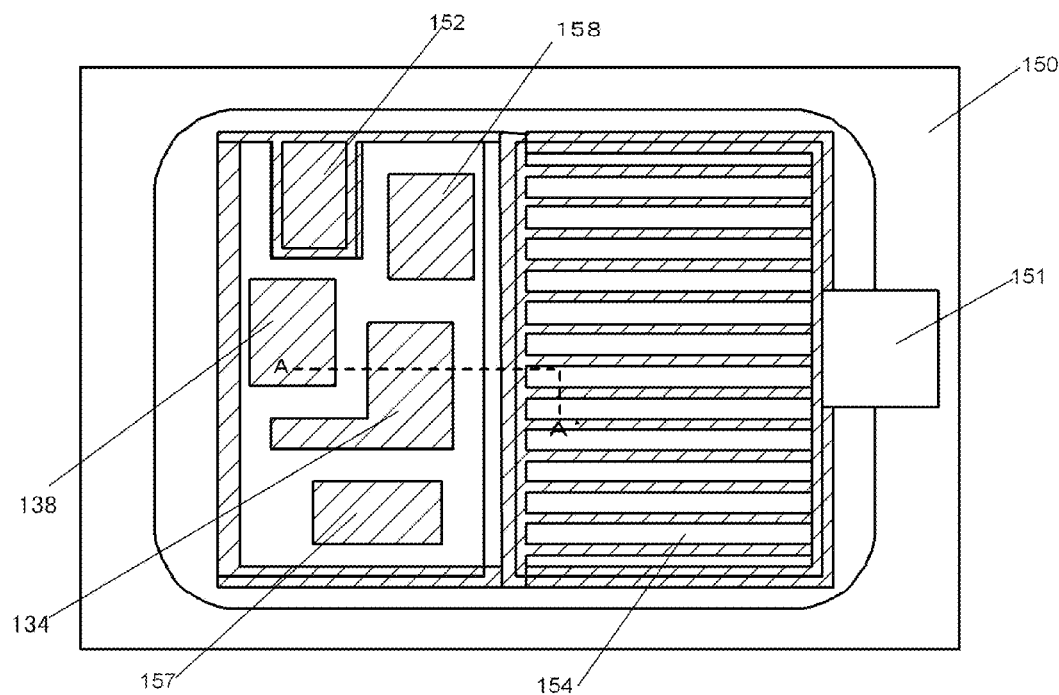
FIG. 16 is a plan view showing the semiconductor device according to the second embodiment of the invention.
Figure 17:
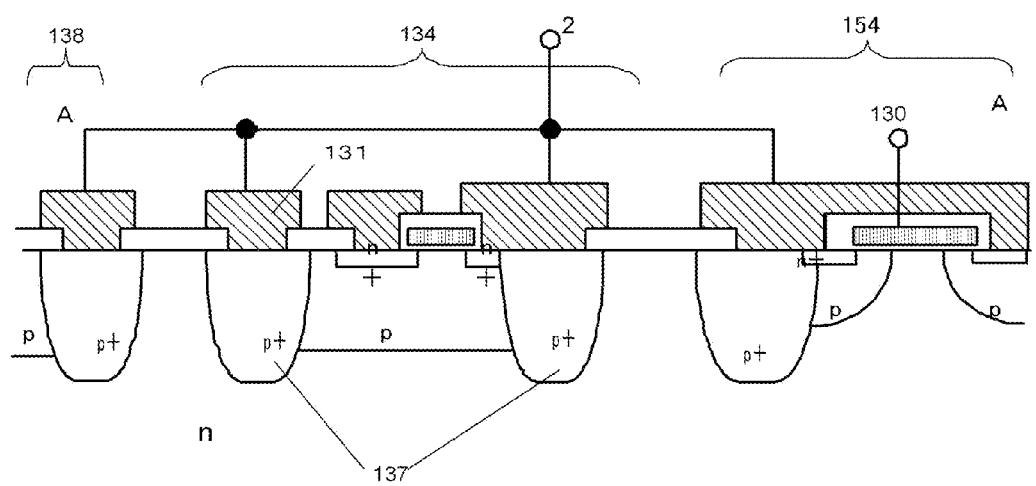
FIG. 17 is a sectional view along A to A of FIG. 16.
Figure 18:
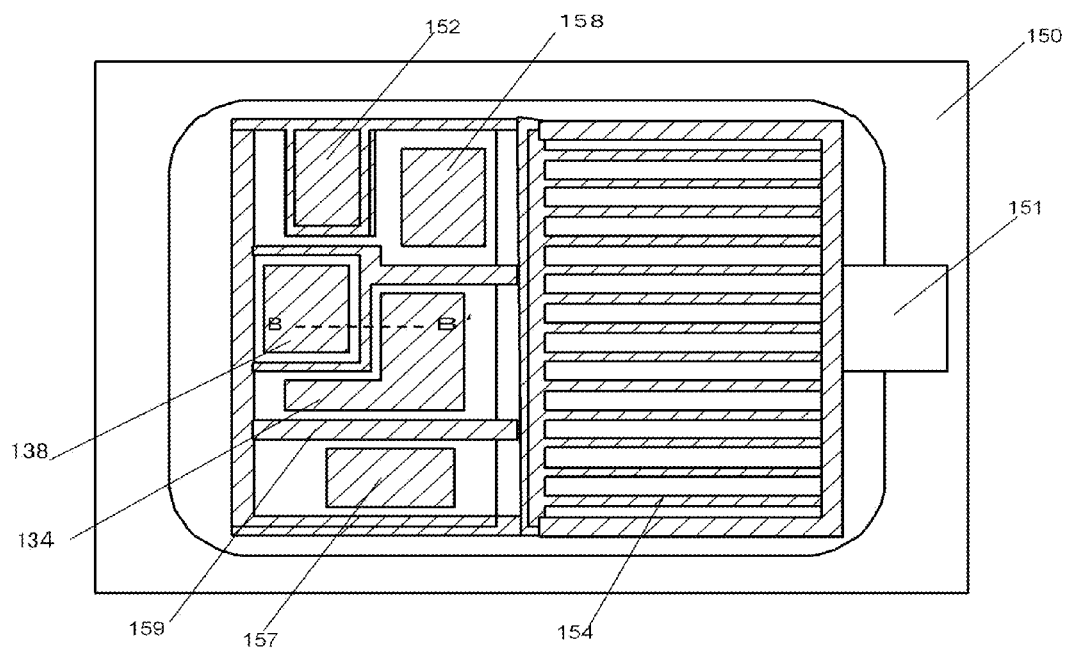
FIG. 18 is a plan view showing a semiconductor device according to a third embodiment of the invention.
Figure 19:
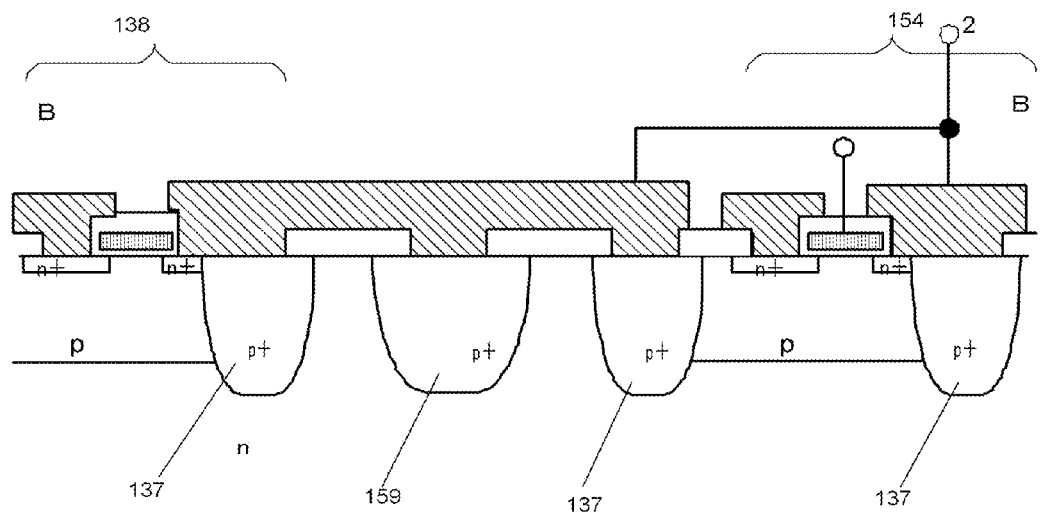
FIG. 19 is a sectional view along B to B of FIG. 18.

Hereafter, a description will be given of a more preferable example of a configuration portion wherein the separation distance is shortened, with a configuration differing still further from the previously described configuration. Regarding other configurations and the configuration wherein the buffer layer is formed of two layers, the same kinds of configuration as previously described are included. FIGS. 16 and 18 are plan views showing a preferable example of an IGBT equipped with a protective circuit whose planar disposition differs from that of the previously described control circuit portion, but which functionally has the same functions, wherein the separation configuration between the control circuit portion and IGBT portion differs. FIGS. 17 and 19 show a cross-section along A to A of FIG. 16 and a cross-section along B to B of FIG. 18 respectively.

Figure 20:
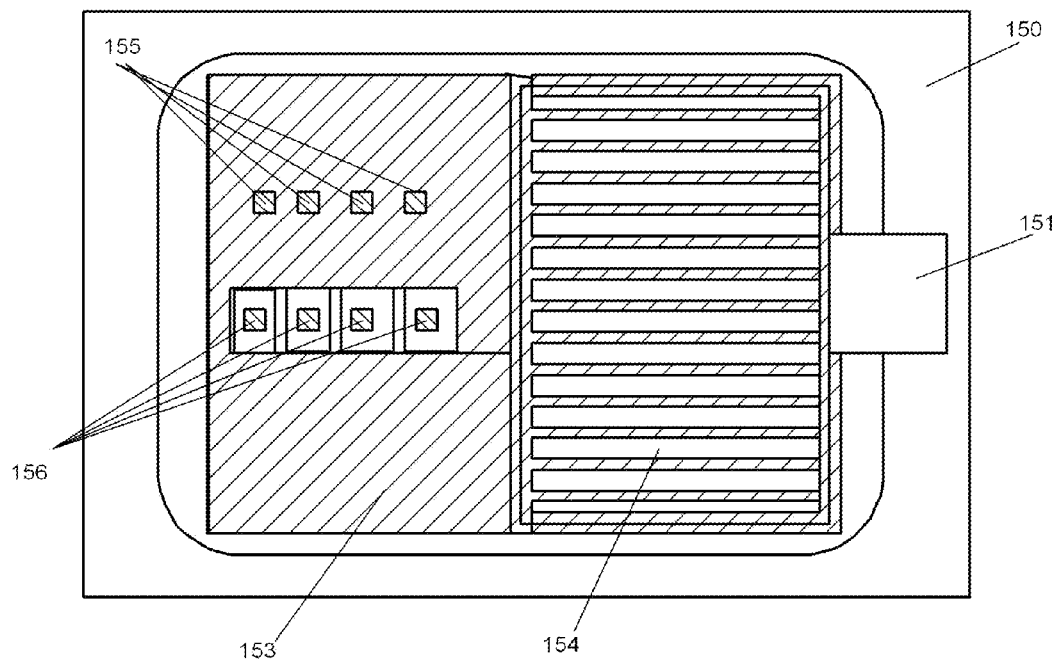
FIG. 20 is a plan view of an experimental semiconductor device for obtaining the semiconductor device according to the third embodiment of the invention.
Figure 21:
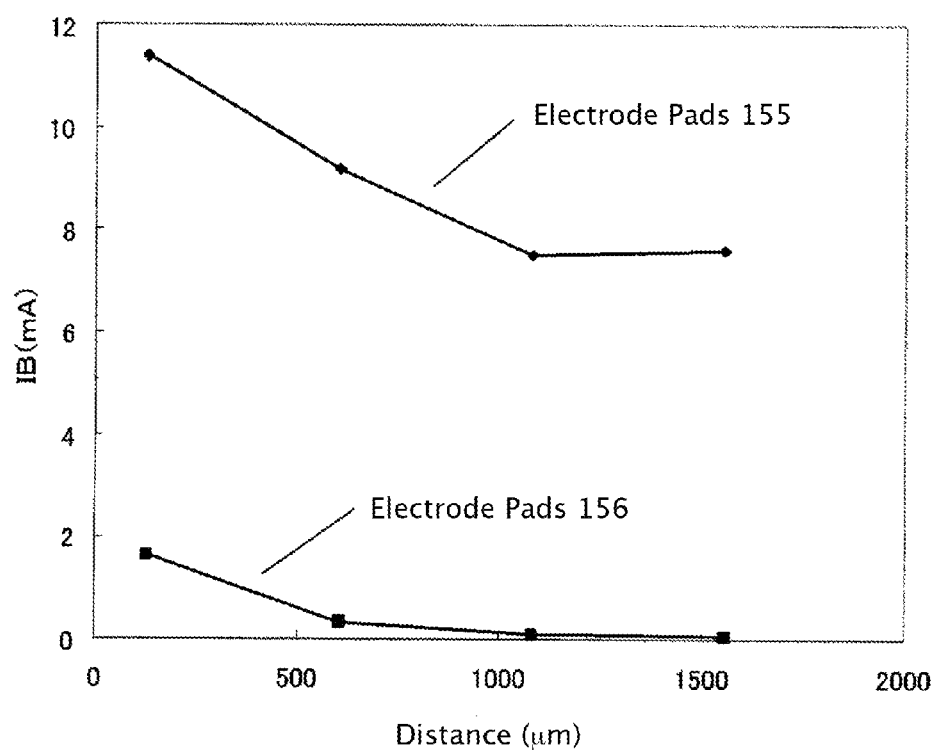
FIG. 21 is a relationship diagram showing a separating effect by separation distance of a control circuit portion and IGBT portion of the semiconductor device according to the third embodiment of the invention.

FIG. 20 is a plan view showing a chip distribution of a testing IGBT used in an experiment for determining the IGBT having the preferable separation configuration shown in FIGS. 16 to 19. The right side region of the chip shown in FIG. 20 is IGBT 154, and p region 153 (diagonal hatching) on the left side of the chip is a portion corresponding to a protective circuit portion covered by a p-type region. In p region 153, a portion in which there is no p region (a blank portion in FIG. 20) is formed in a plurality of places (four places in FIG. 20), and an electrode is formed in the center of each, forming current detecting electrode pads 156 whose distance from the IGBT gradually increases. The p-type region is formed directly beneath electrode pads 156. Separately from this, electronic pads 155 for measuring a parasitic current flowing through p region 153 are provided in a plurality of places (four places in FIG. 20) on the surface of p region 153, moving gradually away from the IGBT in the same way. A current is caused to flow into IGBT 154 on the right side, and the current flowing is measured while maintaining the potential of each of electronic pads 155 and 156 at the same potential as that of an emitter of IGBT 154. Because of this, it is possible to monitor what kind of parasitic current is flowing in the actual protective circuit portion. The disposed measuring electrode pads 155 and 156 have a size of 100 µm per side. One example of a result thereof is shown in FIG. 21. The measurements show the current flowing through each of measuring electrode pads 155 and 156 when a current of 1 A is caused to flow through IGBT 154, and the horizontal axis shows the distance from IGBT 154 to each of measuring electrode pads 155 and

156. As is clear from FIG. 21, a current approximately 10 times or more greater than that in the separated p region measuring electrode pads 156 is flowing through measuring electrode pads 155, which are in large p region 153. Also, in the separated p region measuring electrode pads 156, the current decreases sharply to one tenth or less on the distance from IGBT 154 increasing. Meanwhile, in measuring electrode pads 155 in the large p region, while there is a certain decrease, it stops at a decrease of around 30%. Although it is not possible to explain this kind of phenomenon with a two-dimensional simulation, with a three-dimensional simulation it is seen that, in the case of measuring electrode pads 155 in large p region 153, hole currents flowing into the periphery gather at measuring electrode pads 155 due to a distributed resistance existing in peripheral p region 153. Meanwhile, in separated p region measuring electrode pads 156, it is seen that, as only hole currents dependent on a hole density distribution immediately beneath p region 153 flow, there is hardly any effect from peripheral p region 153. These results, being results which simply cannot be derived from a heretofore known two-dimensional simulation, are facts revealed by actual measurements.

Based on the experiment results, the preferable IGBT configuration shown in FIGS. 16 to 19 is arrived at. Hereafter, referring to the attached drawings, a detailed description will be given of a preferred embodiment of the internal combustion engine igniter semiconductor device. In the following description of the embodiment and attached drawings, the same reference numerals and characters are given to identical configurations, and a redundant description is omitted.

FIG. 16 is a plan view showing a chip configuration of a protective circuit-equipped IGBT according to a third embodiment. In order to apply the experiment results obtained, a protective circuit portion on the left side of the chip is divided into p regions of appropriate circuit blocks 134, 138, 157, and 158. Circuit blocks 134, 138, 157, and 158 may be circuit blocks that perform a certain function, or may simply be divided for the sake of disposition. The p region of each of circuit blocks 134, 138, 157, and 158 is connected at the surface with metal electrode 131 (FIG. 17), and connected to an emitter region of IGBT 154. The reference numeral 150 is a p+ substrate, the reference numeral 151 a zener diode, and the reference numeral 152 a gate pad (FIG. 16). FIG. 17 shows a sectional view along A to A of FIG. 16. In FIG. 17, the IGBT is 154, and the separated circuit blocks are 134 and 138. At least the periphery of each circuit block, and the periphery of a MOSFET, are surrounded by high concentration p region 137 in the way heretofore known. By so doing, a parasitic current flowing into each of circuit blocks 134, 138, 157, and 158 is reduced, as found from the experiment results, and it is difficult for a latch-up to occur. As a result, breakdown capabilities such as an electrostatic discharge (ESD) or an avalanche withstand capability increase considerably.

FIG. 18 is a plan view showing areas between the p regions of circuit blocks 134, 138, 157, and 158 disposed so as to be enclosed by high concentration p region 159 in order to obtain a configuration still nearer the experiment. A sectional structure of a B to B region in the diagram is shown in FIG. 19. In the case of the configuration of FIG. 19, as there exists high concentration p region 159 enclosing the periphery of each circuit block 138 and, furthermore, connected to an emitter of IGBT 154, there is a characteristic wherein the effect from the distribution of a peripheral hole current is further reduced. However, when comparing with the IGBT of FIG. 16, the area increases slightly due to the extra p region 159 being added.

Thus, a semiconductor device used in an internal combustion engine igniter has been described according to the present invention. Many modifications and variations may be made to the techniques and structures described and illustrated herein without departing from the spirit and scope of the invention. Accordingly, it should be understood that the devices and methods described herein are illustrative only and are not limiting upon the scope of the invention.

This application is based on and claims priority to Japanese Patent Application 2009-276804, filed on Dec. 4, 2009. The disclosure of the priority application in its entirety, including the drawings, claims, and the specification thereof, is incorporated herein by reference.

What is claimed is:

1. An internal combustion engine igniter semiconductor device, comprising:
   a semiconductor substrate including a first conductive collector layer, a second conductive buffer layer, and a second conductive base layer in that order, the second conductive buffer layer having a second buffer layer with a higher impurity concentration than that of the second conductive base layer disposed on the second conductive base layer side, and a first buffer layer with a higher impurity concentration than that of the second buffer layer disposed on the first conductive collector layer side;
   an insulated gate bipolar transistor including a first conductive base region disposed on a surface layer of the second conductive base layer of the semiconductor substrate, a gate electrode across a gate insulating film on a surface of the first conductive base region sandwiched between a second conductive emitter region disposed on a surface layer in the first conductive base region and the second conductive base layer surface, and an emitter electrode in common contact with a collector electrode, the second conductive base layer, and the second conductive emitter region on the first conductive collector layer surface;
   a clamp diode between the gate electrode and the collector electrode with the gate electrode side as an anode side; and
   a control circuit which, being on the same semiconductor substrate as the insulated gate bipolar transistor, and enclosed in a ring form by an other conductive region connected by wire to the emitter electrode, detects an abnormal condition of the insulated gate bipolar transistor using a signal from the emitter electrode, and prevents a breakdown of the insulated gate bipolar transistor by controlling a gate voltage, wherein
   a total thickness of the first buffer layer and second buffer layer is 50 µm or less, and an overall impurity amount of the two layers is $20 \times 10^{13}$ cm$^{-2}$ or less, and
   the thickness of the first buffer layer is from 1 to 10 µm or less, the impurity concentration of the first buffer layer is in the range of $2 \times 10^{16}$ cm$^{-3}$ to $8 \times 10^{16}$ cm$^{-3}$, the thickness of the second buffer layer is 49 µm or less, and the impurity concentration of the second buffer layer is in the range of $1 \times 10^{16}$ cm$^{-3}$ to $4 \times 10^{16}$ cm$^{-3}$.

2. The internal combustion engine igniter semiconductor device according to claim 1, wherein the total thickness of the first buffer layer and second buffer layer is 30 µm or more.

3. The internal combustion engine igniter semiconductor device according to claim 1, additionally comprising a trench filled with an insulator between the insulated gate bipolar transistor and the control circuit in place of the other conductive region connected to the emitter electrode.

4. The internal combustion engine igniter semiconductor device according to claim 3, wherein the depth of the trench reaches the first conductive collector layer.

5. The internal combustion engine igniter semiconductor device according to claim 4, wherein the width of the trench is 1 μm or less, and a plurality of trenches are provided in parallel.

6. The internal combustion engine igniter semiconductor device according to claim 1, wherein the control circuit enclosed by the other conductive region is divided into insular circuit blocks, and each of the insular circuit blocks is connected by wire to the emitter electrode.

7. The internal combustion engine igniter semiconductor device according to claim 6, wherein a high concentration other conductive band-like region is interposed among the insular circuit blocks, and the high concentration other conductive band-like region is connected by wire to the emitter electrode and the other conductive region.

* * * * *